United States Patent [19]

Delfyett, Jr.

[11] Patent Number: 5,265,107
[45] Date of Patent: Nov. 23, 1993

[54] BROADBAND ABSORBER HAVING MULTIPLE QUANTUM WELLS OF DIFFERENT THICKNESSES

[75] Inventor: Peter J. Delfyett, Jr., Middletown, N.J.

[73] Assignee: Bell Communications Research, Inc., Livingston, N.J.

[21] Appl. No.: 831,467

[22] Filed: Feb. 5, 1992

[51] Int. Cl.⁵ .............................................. H01S 3/10
[52] U.S. Cl. ................................... 372/11; 359/245; 372/18; 372/20; 372/25
[58] Field of Search ................ 372/11, 9, 10, 18, 20, 372/25; 359/244, 240, 245

[56] References Cited

U.S. PATENT DOCUMENTS

| | | | |
|---|---|---|---|
| 4,720,309 | 1/1988 | Deveaud et al. | 372/11 |
| 4,846,931 | 7/1989 | Gmitter et al. | 156/633 |
| 5,119,227 | 6/1992 | Dawson et al. | 372/11 |

OTHER PUBLICATIONS

G. A. Alphonse et al., "High-Power Superluminescent Diodes," IEEE Journal of Quantum Electronics, Dec. 12, 1988, vol. 24, pp. 2454-2457.

J. A. Valdmanis et al., "Generation of optical pulses as short as 27 femtoseconds directly from a laser balancing self-phase modulation, group-velocity dispersion, saturable absorption, and saturable gain," Optics Letters, Mar. 1985, vol. 10, pp. 131-133.

A. M. Weiner et al., "Picosecond and femtosecond Fourier pulse shape synthesis," Revue Physique Applique, Dec. 1987, vol. 22, pp. 1619-1628.

P. J. Delfyett et al., "Generation of subpicosecond high-power optical pulses frm a hybrid mode-locked semiconductor laser," Optics Letters, Dec. 1, 1990, vol. 15, No. 23, pp. 1371-1373.

Y. Silberberg et al., "Subpicosecond Pulses from a Mode-Locked Semiconductor Laser," IEEE Journal of Quantum Electronics, Jun. 6, 1986, vol. QE-22, pp. 759-761.

E. Yablonovitch et al., "Extreme selectivity in the lift-off of epitaxial GaAs films," Applied Physics Letters, Dec. 28, 1987, vol. 51, pp. 2222-2224.

Primary Examiner—James W. Davie
Attorney, Agent, or Firm—Leonard Charles Suchyta; James W. Falk

[57] ABSTRACT

A saturable absorber comprising multiple quantum-well layers (32, 34, 36) of differing thicknesses and separated by barrier layers (38) so as to produce a wide-band absorption. Such a saturable absorber (30) is useful in a hybrid mode-locked laser having an optical cavity defined by two mirrors (10, 12) into which are placed the saturable absorber (30) and an optical amplifier (14) driven by both a DC bias and an RF modulation signal.

7 Claims, 2 Drawing Sheets

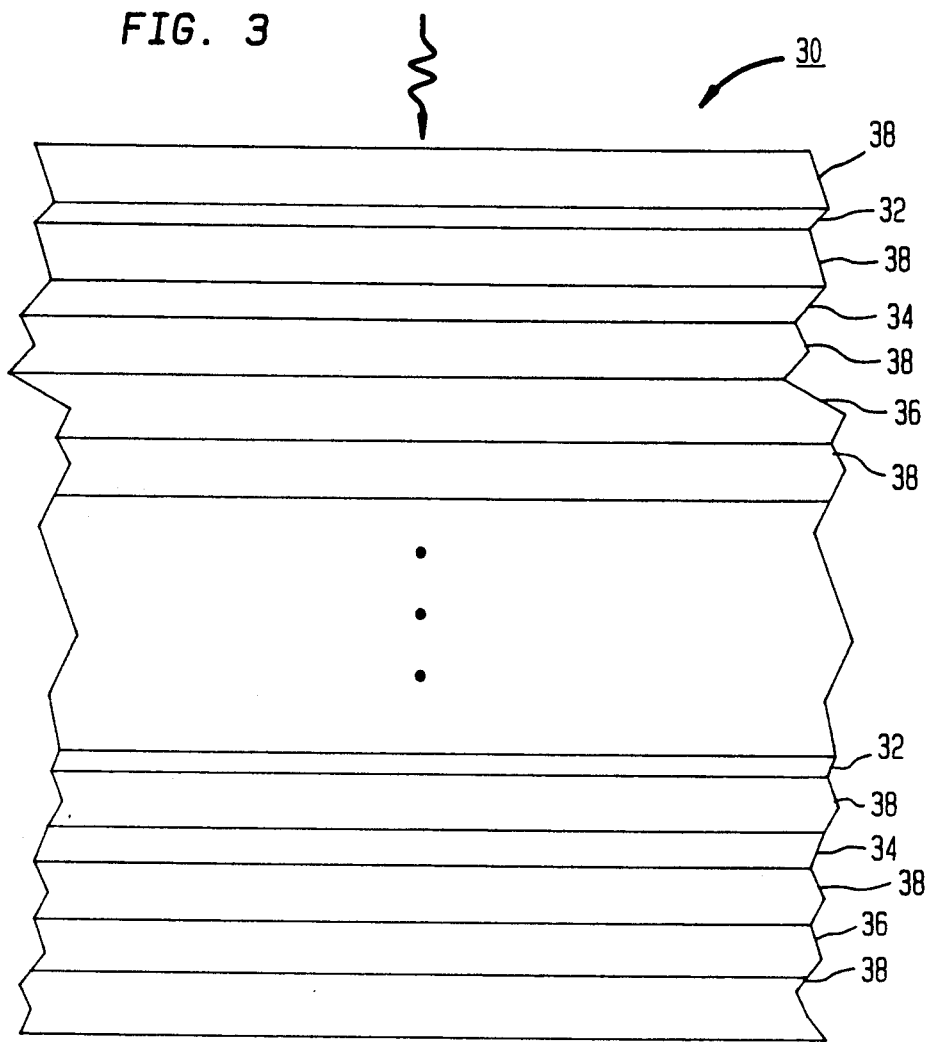
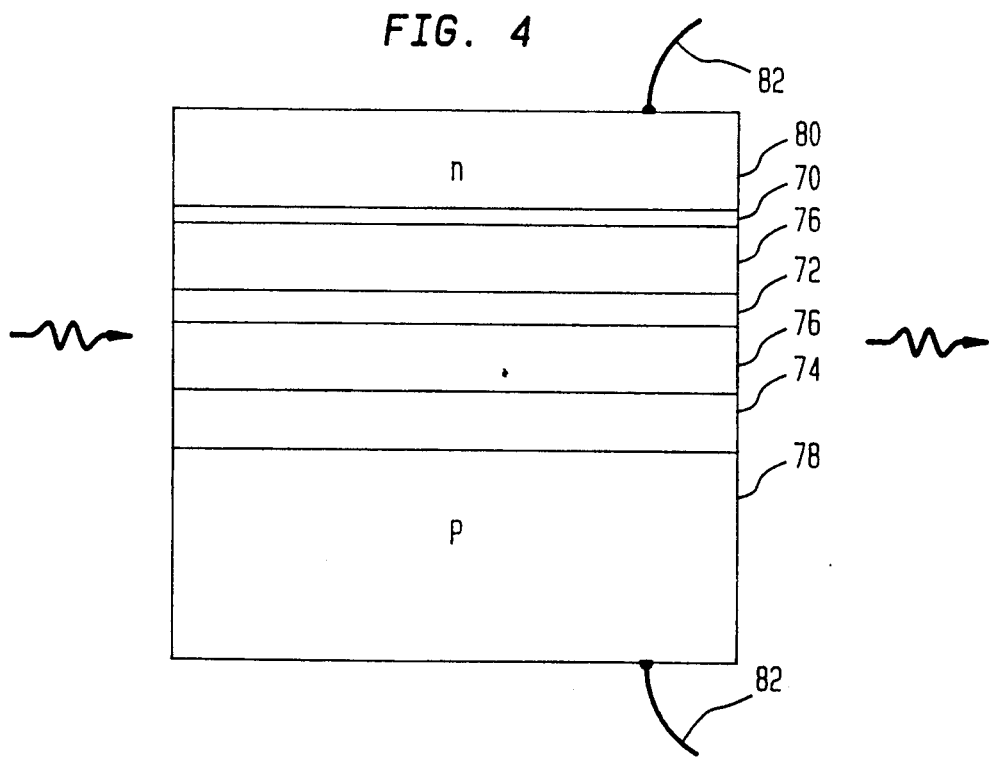

BROADBAND ABSORBER HAVING MULTIPLE QUANTUM WELLS OF DIFFERENT THICKNESSES

FIELD OF THE INVENTION

The invention relates generally to multiple-quantum-well optical absorbers. In particular, the invention relates to the use of such absorbers in a mode-locked laser.

BACKGROUND ART

Delfyett et al. have disclosed a high-power, narrow-pulsewidth laser in "Generation of subpicosecond high-power optical pulses from a hybrid mode-locked semiconductor laser," *Optics Letters*, volume 15, 1990, pp. 1371–1373. This laser, whose essential elements are illustrated in FIG. 1, combines passive and active mode locking. An optical cavity is formed between a fully silvered mirror 10 and a partially silvered mirror 12. That is, the fully silvered mirror 10 is highly reflective while the partially silvered mirror 12 transmits a portion of the light as the laser output. The cavity length L is relatively long so that it supports a large number of optical modes having a frequency spacing of $$\Delta f = \frac{c}{2 \cdot L}, \quad (1)$$

where c is the speed of light taking into account any dielectric material within the cavity. A semiconductor optical amplifier or traveling wave amplifier 14 is disposed in the middle of the cavity and is driven by both a DC bias and an RF signal at frequency $f_{RF}$ coupled into the amplifier 14 through an inductor 16 and capacitor 18 respectively. A thin multiple quantum-well structure 20 affixed to the fully silvered mirror 10 serves as a saturable absorber, following the disclosure of Silberberg et al. in "Subpicosecond Pulses from a Mode-Locked Semiconductor Laser," IEEE *Journal of Quantum Electronics*, volume QE-22, 1986, pp. 759–761. A saturable absorber is an optical absorber that highly absorbs low-intensity light, but, above a threshold of light intensity, its absorption progressively decreases. A quantum well is a semiconductor layer sandwiched between two barrier layers and of such thinness that quantum levels are formed in the well and the absorption spectrum becomes dependent on the well thickness. All known structures having multiple quantum wells (MQW) have a periodic structure of multiple, equally thick wells separated by equally thick barriers. An MQM structure operates well as the saturable absorber because the MQW room-temperature excitonic resonances saturate at relatively low optical intensities.

Passive mode locking, to be described first, does not require the RF drive signal to be applied to the optical amplifier 14, which instead simply amplifies within its relatively wide gain bandwidth whatever spontaneous optical emission occurs within the cavity. However, only those optical modes supported by the cavity are resonantly amplified. Furthermore, the low-intensity non-resonant modes are preferentially absorbed by the saturable absorber 20. There results a substantial number of amplified resonant modes separated by the frequency spacing $\Delta f$. The saturable absorber 20 further causes these modes to be phase locked so as to maximize the instantaneous intensity of the total optical signal. By straightforward Fourier analysis, an optical signal having many frequency components with a frequency spacing $\Delta f$ has a temporal form of a pulse train having a period $$\rho = \frac{1}{\Delta f} = \frac{2L}{c}. \quad (2)$$

Alternatively stated, the saturable absorber 20 preferentially passes the largest emission noise spike, which the optical amplifier 14 successively amplifies and narrows as the optical pulse passes through the cavity with a round-trip time of $\tau$. Thus, after a relatively short start-up period, the passively mode-locked laser outputs a series of optical pulses having a period $\tau$ set by the cavity so as to be very stable.

Active mode locking does not require the saturable absorber 20. Instead, the optical amplifier 14 is additionally driven by the RF signal so as to modulate the amplification at the RF frequency $f_{RF}$. Such modulation produces phase-locked sidebands spaced on either side of the resonant modes by the modulation frequency $f_{RF}$. If the modulation frequency $f_{RF}$ is chosen to coincide with the mode spacing $\Delta f$, then the RF modulation causes all the resonant modes to be phase-locked. As described above, such a frequency distribution produces an optical pulse train of period $\tau$.

Passive mode locking produces a pulse train of very short pulses but suffers from cavity-length fluctuations so that the pulse period tends to jitter and satellite pulses appear. Active mode locking prevents such dynamical changes so the pulse period is precisely fixed, but the effect of gain-narrowing produces relatively wide and thus low-intensity pulses. Delfyett et al. combine the two types of mode locking so as to produce very short, high-intensity pulses having a stable period and no satellites. Their hybrid mode-locked laser produced pulses of 6 ps width at a wavelength of 828 nm in a pulsetrain having a repetition rate of 302 MHz. A further optical amplifier and pulse compressor reduced the pulsewidth to 460 fs and raised the peak power to 70 W. Nonetheless, the 6 ps pulsewidth in the mode-locked laser was greater than is theoretically possible. It would thus be advantageous to further reduce the pulsewidth and thus increase the peak power.

SUMMARY OF THE INVENTION

The invention can be summarized as a saturable absorber having multiple quantum wells of differing thicknesses, thereby broadening the excitonic resonances. When incorporated into a hybrid mode-locked laser, the broadband saturable absorber allows a shorter pulsewidth.

BRIEF DESCRIPTION OF THE DRAWINGS

FIG. 3 is a cross-sectional diagram of a saturable absorber having multiple quantum wells of differing thicknesses.

FIG. 4 is a cross-sectional diagram of a broadband multiple quantum-well laser of the invention.

DETAILED DESCRIPTION OF THE PREFERRED EMBODIMENT

Figure 1:
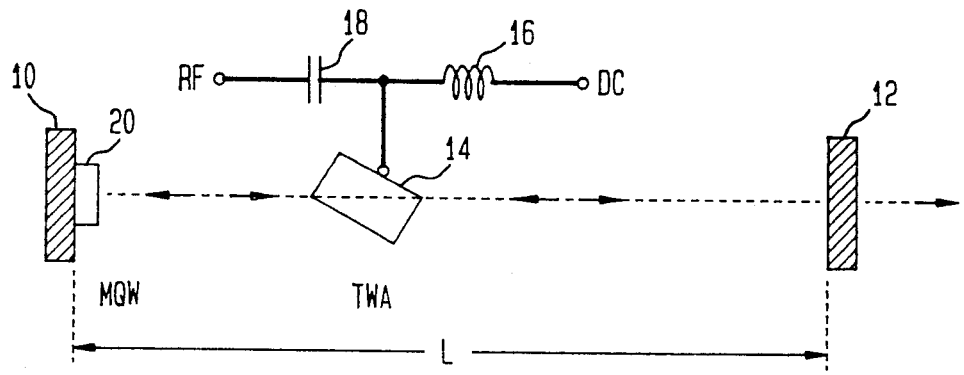
FIG. 1 is a schematic diagram illustrating the important parts of a hybrid mode-locked laser of the prior art.
Figure 2:
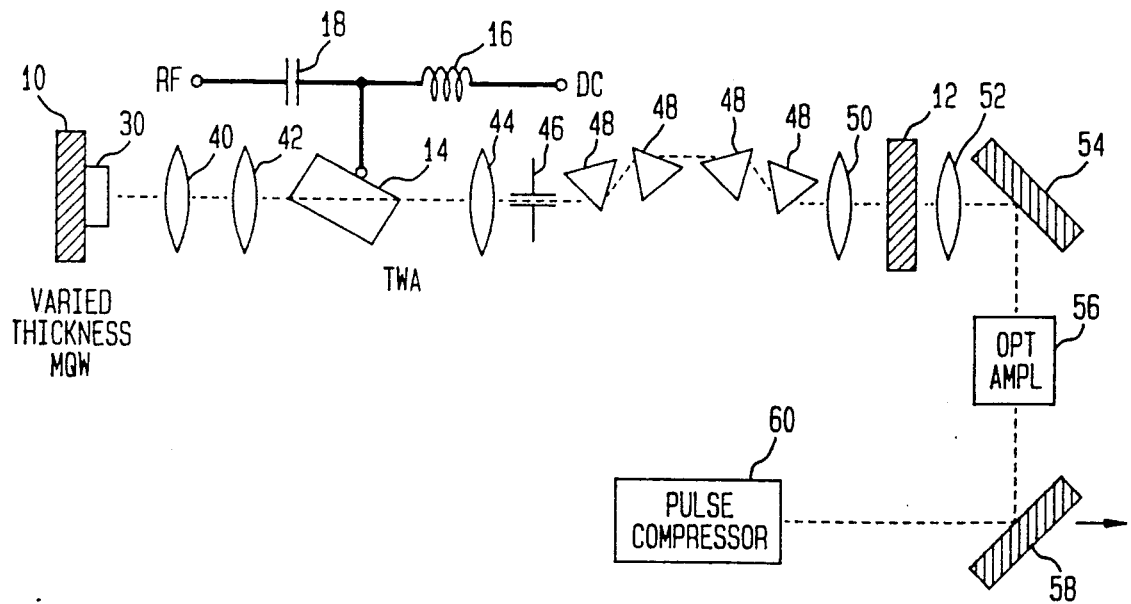
FIG. 2 is a schematic diagram of an embodiment of the mode-locked laser of the present invention, also including an optical output amplifier and a pulse compressor.

A mode-locked laser 30 of the invention, illustrated in FIG. 2, includes the mirrors 10 and 12 and the DC and RF driven optical amplifier 14 of the laser of FIG. 1, but, in place of the conventional multiple quantum-well saturable absorber 20, its saturable absorber 30 has multiple quantum wells of differing thicknesses. As illustrated in cross-section in FIG. 3, the variable-thickness MQW saturable absorber 30 includes quantum-well layers 32, 34, and 36 of differing thicknesses. Barrier layers 38 separate the quantum-well layer 32, 34, and 36. Each quantum-well layer 32, 34, or 36 has a relatively narrow absorption spectrum, the spectral center of which is determined by the layer thickness. The total absorption is the sum of the individual absorptions so the differing thicknesses of the quantum wells 32, 34, and 36 broaden the absorption spectrum. Thereby, the variable-thickness multiple quantum-well saturable absorber 30 can saturate over a wider bandwidth and thus can produce a shorter mode-locked pulse. This structure of quantum wells of differing thicknesses may be repeated to form the illustrated periodic structure which has a larger absorption coefficient.

EXAMPLE

An example of the variable-thickness MQW saturable absorber 30 was fabricated and tested. Molecular beam epitaxy (MBE) was used to first deposit a release layer of AlAs on a GaAs substrate. Then, fifty periods of the structure 30 of FIG. 3 were grown on the release layer. Each period consisted of a first quantum-well layer 32 of 7 nm thickness, a second quantum-well layer 34 of 7.5 nm thickness, and a third quantum-well layer 36 of 8 nm thickness. The thicknesses thus vary such that the closest thicknesses are different by between 7.1% and 6.25%. All the quantum-well layers 32, 34, and 36 were composed of $Al_{0.3}Ga_{0.7}As$, which was initially undoped. Barrier layers 38 of 10 nm-thick GaAs separated the quantum-well layers 32, 34, and 36. After the structure was grown, 200 keV protons irradiated it to a fluence of $10^{13} cm^{-2}$ so as to reduce the absorber recovery time.

The saturable absorber structure 30 was then lifted off the GaAs substrate by etching away the release layer and was Van der Waals bonded to the fully silvered reflector 10, as illustrated in the schematic diagram of FIG. 2, using the epitaxial lift-off procedure disclosed by Gmitter et al. in U.S. Pat. Nos. 4,846,931 and 4,883,561 and by Yablonovitch et al. in "Extreme selectivity in the lift-off of epitaxial GaAs films," *Applied Physics Letters*, volume 51, 1987, pp. 2222-2224.

The optical amplifier 14 was an AlGaAs angled striped semiconductor traveling-wave optical amplifier, as has been described by Alphonse et al. in "High Power Superluminescent Diodes," *IEEE Journal of Quantum Electronics*, volume 24, 1988, pp. 2454-2457. It was placed 15 cm from the fully silvered reflector 10. A lens 40 produced a focused beam incident upon the sataurable absorber 30 and reflector 10. Lenses 42 and 44 produced collimated beams exiting from the opposing ends of the optical amplifier 14 while the lens 44 produced a collimated beam through a slit 46. The collimated beam passed through four prisms 48 in order to compensate for intracavity group-velocity dispersion following the technique described by Valdmanis et al. in "Generation of optical pulses as short as 27 femtoseconds directly from a laser balancing self-phase modulation, group-velocity dispersion, saturable absorption, and saturable gain," *Optics Letters*, volume 10, 1985, pp. 131-133. The prisms 48 were composed of the glass type SF18 having an index of refraction of 1.72 and were separated by 33 cm. The partially silvered reflector 12 transmitted 50% of the incident light and thus acted as the output coupler. A lens 50 is focused on the output coupler to increase the cavity stability.

The cavity defined by the reflectors 10 and 12 produced a fundamental longitudinal mode spacing of 111.8 MHz. Under passively modelocked operation, the laser oscillator operated at a repetition rate of 335.4 MHz owing to the finite gain-recovery time of the laser diode. In order to achieve hybrid modelocked operation, an RF signal of about 0.5 W power was applied to the optical amplifier 14. The RF frequency $f_{RF}$ was chosen to match the third harmonic of the fundamental frequency, that is, 335.4 MHz.

The RF signal caused the passively modelocked output spectrum to be significantly widened to a lasing bandwidth of 7.2 nm centered at 838 nm. The optical pulses were highly chirped with a pulse duration of about 10 ps and a time-bandwidth product of 30. It appears that the gain dynamics of hybrid modelocked lasers produce optical nonlinearities that are too large to be compensated by prisms. It would be beneficial to completely compensate the frequency chirping within the cavity, for example, with gratings. Instead, the example used extra-cavity compensation.

The output beam was collimated by a lens 52 and reflected by a mirror 54 into an output optical amplifier 56 of the type described in the Delfyett et al. article. It contained an optical isolator and an optical traveling wave amplifier identical to the optical amplifier 14 but with no RF modulation. The output optical amplifier 56 amplified an average input power of 1-2 mW into an average output power of 30 mW, corresponding to over 100 pJ per pulse. The amplified pulses were then reflected by a canted, semi-reflecting mirror 58 into a dual-grating pulse compressor 60 arranged in a double-pass geometry so that the compressed pulse past through the semi-reflecting mirror 58. The pulse compressor 60 is described in the Delfyett et al. article and by Weiner et al. in "Picosecond and femtosecond Fourier pulse shape synthesis," *Revue Physique Applique*, volume 22, 1987, pp. 1619-1628.

An auto-correlation trace of the compressed output showed an optical pulsewidth of 207 fs. The average optical power was 11.5 mW with less than 100 $\mu$W of background spontaneous emission. The peak power would thus have been 165 W.

The varied thickness multiple quantum-well saturable absorber of the invention provides a broadened absorption bandwidth and thus allows for the experimentally demonstrated short pulsewidth. It further provides the opportunity to tune the optical frequency of the pulse.

Although the example above incorporated quantum wells of three different thickness varying over about 12%, both the number of different thicknesses and the variational range could be increased so as to give a broader absorption spectrum. For example, a saturable absorber could be built with quantum wells having thicknesses of 6, 6.5, 7, 7.5, 8, 8.5, and 9 nanometers, all separated by 10 nm barriers. The thicknesses thus vary such that the closest thicknesses are different by between 8.33% and 5.6%.

The RF frequency may be varied from that of the example, for example, to any value above 10 MHz.

The invention can also be applied to broaden the gain spectrum of a quantum-well optical amplifier. Multiple quantum-well semiconductor optical amplifiers and lasers are well known in which the quantum wells absorb radiation and coherently emit radiation under forward electrical bias. However, according to the invention and as illustrated in cross-section in FIG. 4, the active region of the optical amplifier includes multiple quantum wells 70, 72, and 74 of differing thicknesses and separated by barrier layers 76, similarly to the saturable absorber 30 of FIG. 3. The layers 70, 72, 74, and 76 of the active region are undoped and are sandwiched between a p-type substrate 78 and an n-type anode layer 80. All layers 70 through 80 are epitaxially grown layers of one of the III–V semiconductor families, for example, GaAs and AlGaAs or InP and InGaAsP. Electrodes 82 attached to the substrate 78 and anode layer 80 bias the p/n junction in the forward direction. Thereby, light traveling parallel to the quantum-well layers is amplified in a broadened gain band.

Thus the invention allows for a broadening of the absorption bandwidth and a substantial reduction of the pulsewidth by a relatively small variation of the structure of the absorber.

What is claimed is:

1. A saturable absorber, comprising:
   a first plurality of semiconductor quantum-well layers having substantially different respective thicknesses the closest values of which vary by no more than approximately 8.3%; and
   at least one barrier layer separating said quantum-well layers.

2. A saturable absorber as recited in claim 1, wherein said first plurality comprises at least three of said quantum-well layers having substantially different respective thicknesses.

3. A saturable absorber as recited in claim 2, wherein said first plurality comprises at least three of said semiconductor quantum-well layers and wherein said different thicknesses have values varying over a range of at least 12%.

4. A saturable absorber as recited in claim 1, wherein said different thicknesses differ over a range extending for at least 5 nm.

5. A saturable absorber as recited in claim 1, further comprising a reflective body to which said first plurality of quantum-well layers and said at least one barrier layer are affixed.

6. A mode-locked laser, comprising:
   an optical cavity having first and second reflective ends;
   an optical gain medium disposed in said cavity; and
   a multiple quantum-well saturable absorber disposed in said cavity and comprising multiple semiconductor quantum-well layers of substantially different thicknesses, the closest values of which vary by no more than approximately 8.3% and which are separated by at least one barrier layer.

7. A saturable reactor comprising
   a periodic structure of multiple pluralities of semiconductor quantum-well layers, each of said pluralities of quantum-well layers having substantially different thickness, closest values of said thicknesses of said plurality of quantum-well layers differing by no more than approximately 8.3%, and barrier layers separating said quantum-well layers.

* * * * *